(12) United States Patent
Hsieh et al.

(10) Patent No.: US 9,047,658 B2
(45) Date of Patent: Jun. 2, 2015

(54) METHOD OF OPTICAL PROXIMITY CORRECTION

(71) Applicant: UNITED MICROELECTRONICS CORP., Hsin-Chu (TW)

(72) Inventors: Te-Hsien Hsieh, Kaohsiung (TW); Ming-Jui Chen, Hsinchu (TW); Cheng-Te Wang, Hsinchu County (TW); Ping-I Hsieh, Tainan (TW); Jing-Yi Lee, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 78 days.

(21) Appl. No.: 14/071,667

(22) Filed: Nov. 5, 2013

(65) Prior Publication Data

US 2015/0125063 A1    May 7, 2015

(51) Int. Cl.
*G06K 9/00* (2006.01)
*G06T 7/00* (2006.01)

(52) U.S. Cl.
CPC ..... *G06T 7/0004* (2013.01); *G06T 2207/30148* (2013.01); *G06K 9/00* (2013.01)

(58) Field of Classification Search
USPC ......... 382/103, 131, 159, 224, 254, 255, 266, 382/274, 275, 284, 300
See application file for complete search history.

(56) References Cited

U.S. PATENT DOCUMENTS

| | | | |
|---|---|---|---|
| 5,046,012 A | 9/1991 | Morishita | |
| 5,453,844 A * | 9/1995 | George et al. | 382/264 |
| 5,466,904 A * | 11/1995 | Pfeiffer et al. | 219/121.25 |
| 5,767,974 A * | 6/1998 | Higashiguchi et al. | 356/394 |
| 5,879,844 A | 3/1999 | Yamamoto | |
| 6,120,953 A * | 9/2000 | Lin | 430/30 |
| 6,137,901 A * | 10/2000 | Harazaki | 382/144 |
| 6,396,943 B2 * | 5/2002 | Yamashita | 382/144 |
| 6,425,117 B1 | 7/2002 | Pasch | |
| 6,691,297 B1 * | 2/2004 | Misaka et al. | 716/53 |
| 6,868,175 B1 * | 3/2005 | Yamamoto et al. | 382/145 |
| 7,489,335 B2 * | 2/2009 | Kochi et al. | 348/180 |
| 7,561,186 B2 * | 7/2009 | Poon | 348/208.99 |
| 7,694,267 B1 * | 4/2010 | Ye et al. | 716/53 |
| 7,817,844 B2 * | 10/2010 | Kitamura et al. | 382/141 |
| 7,861,207 B2 | 12/2010 | Word | |
| 8,016,277 B2 * | 9/2011 | Choi et al. | 269/58 |
| 8,156,116 B2 * | 4/2012 | Graham et al. | 707/728 |
| 8,184,926 B2 * | 5/2012 | Sun et al. | 382/275 |
| 8,203,615 B2 * | 6/2012 | Wang et al. | 348/208.4 |
| 8,249,377 B1 * | 8/2012 | Banner et al. | 382/255 |
| 8,489,987 B2 * | 7/2013 | Erol et al. | 715/273 |

(Continued)

*Primary Examiner* — Barry Drennan
*Assistant Examiner* — Aklilu Woldemariam
(74) *Attorney, Agent, or Firm* — Winston Hsu; Scott Margo (57) ABSTRACT

A calculation method of optical proximity correction includes providing at least a feature pattern to a computer system. At least a first template and a second template are defined so that portions of the feature pattern are located in the first template and the rest of the feature pattern is located in the second template. The first template and the second template have a common boundary. Afterwards, a first calculation zone is defined to overlap an entire first template and portions of the feature pattern out of the first template. Edges of the feature pattern within the first calculation zone are then fragmented from the common boundary towards two ends of the feature pattern so as to generate at least two first beginning segments respectively at two sides of the common boundary. Finally, positions of the first beginning segments are adjusted so as to generate first adjusted segments.

22 Claims, 6 Drawing Sheets

(56) References Cited

U.S. PATENT DOCUMENTS

| | | | |
|---|---|---|---|
| 2002/0045136 A1* | 4/2002 | Fritze et al. | 430/322 |
| 2005/0068467 A1* | 3/2005 | Bleeker et al. | 349/4 |
| 2005/0089211 A1* | 4/2005 | Gallatin et al. | 382/144 |
| 2005/0238965 A1* | 10/2005 | Tyrrell et al. | 430/5 |
| 2005/0249429 A1* | 11/2005 | Kitamura | 382/255 |
| 2006/0002603 A1* | 1/2006 | Beauchaine et al. | 382/141 |
| 2008/0025627 A1* | 1/2008 | Freeman et al. | 382/255 |
| 2008/0062287 A1* | 3/2008 | Agrawal et al. | 348/241 |
| 2008/0240607 A1* | 10/2008 | Sun et al. | 382/275 |
| 2008/0295059 A1* | 11/2008 | Choi | 716/19 |
| 2009/0324126 A1* | 12/2009 | Zitnick et al. | 382/275 |
| 2010/0058281 A1* | 3/2010 | Fujimura et al. | 716/21 |
| 2010/0198875 A1* | 8/2010 | Rieger et al. | 707/793 |
| 2010/0329582 A1* | 12/2010 | Albu et al. | 382/255 |
| 2011/0019909 A1* | 1/2011 | Farid et al. | 382/160 |
| 2011/0090352 A1* | 4/2011 | Wang et al. | 348/208.6 |
| 2011/0102642 A1* | 5/2011 | Wang et al. | 348/241 |
| 2011/0115934 A1* | 5/2011 | Wang | 348/222.1 |
| 2011/0188770 A1* | 8/2011 | Weinberger et al. | 382/255 |
| 2011/0267507 A1* | 11/2011 | Kane et al. | 348/241 |
| 2011/0292216 A1* | 12/2011 | Fergus et al. | 348/164 |
| 2012/0307116 A1* | 12/2012 | Lansel et al. | 348/273 |
| 2013/0205265 A1* | 8/2013 | Kuo et al. | 716/53 |
| 2015/0030237 A1* | 1/2015 | Jancsary et al. | 382/159 |

* cited by examiner

METHOD OF OPTICAL PROXIMITY CORRECTION

BACKGROUND OF THE INVENTION

1. Field of the Invention

The present invention generally relates to the field of resolution enhancement technologies (RET), and more particularly to a method of optical proximity correction (OPC).

2. Description of the Prior Art

With the trend of miniaturization of electronic products and peripheral devices, research into thin structures and high integration of semiconductor devices has become a main concern in the industry. Lithography technology plays an important role in determining the performance of semiconductor devices.

In semiconductor manufacturing processes, an integrated circuit layout is first designed in an IC-design house and formed as a mask pattern. The mask pattern is then proportionally transferred to a photoresist layer disposed on the semiconductor wafer through an exposure process followed by a development process. Subsequently, a corresponding etching process is performed in order to manufacture the semiconductor devices on the semiconductor wafer. With the demand of increasing integration of semiconductor devices, the design rule of line width and spaces between lines or devices becomes finer. However, due to the optical proximity effect (OPE), the width is subject to optical limitations. To obtain the fine-sized devices, the pitch i.e. the interval between transparent regions in a mask, is scaled down along with the device size. However, if the pitch is scaled down to a specific range (for example, equal to or smaller than half the wavelength of light used in the exposure process), diffraction and interference may be inevitable when the light passes through the mask. The resolution of the mask pattern transferred onto the photoresist layer will be affected; due to the OPE, deviations in the transferred pattern such as rounded right-angle corners, shortened line-ends, or increase/decrease of line widths may occur.

To overcome the above problems, several resolution enhancement technologies (RET) have been studied and commercialized recently. In detail, one of the most common methods adopted by the semiconductor manufacturers is an optical proximity correction (OPC) method. The OPC method is a simulation and correction method in which lines width and/or contours of feature patterns in the individual design layout are properly corrected. After the OPC process, the corrected feature patterns in the individual design layout may be outputted to a mask-making system in order to manufacture the corresponding photomask.

Although the OPC method has been widely adopted by the semiconductor manufacturers and successively overcome major drawbacks in the fabricating process, there are still some problems needing to be solved. During the OPC process, each feature pattern, such as a polygon, in the design layout is often fragmented by dividing the edges of the polygon into several edge segments. However, when the same edges of the polygon are corrected (or fragmented) by two independent OPC processes, the corresponding two edge segments are often mismatched in the following merging process and the elimination of this mismatch is time-consuming and costly. Therefore, how to effectively solve this problem is still a major topic for study in the semiconductor field.

SUMMARY OF THE INVENTION

One object of the present invention is to provide a method of OPC which is able to solve the above-mentioned drawbacks.

According to one embodiment of the present invention, a method of optical proximity correction is provided and at least includes the following steps. First, at least a feature pattern is provided to a computer system. At least a first template and a second template are defined so that portions of the feature pattern are located in the first template and the rest of the feature pattern is located in the second template. The first template and the second template have a common boundary. Afterwards, a first calculation zone is defined to overlap an entire first template and portions of the feature pattern out of the first template. Edges of the feature pattern within the first calculation zone are then fragmented from the common boundary towards two ends of the feature pattern so as to generate at least two first beginning segments respectively at two sides of the common boundary. Finally, positions of the first beginning segments are adjusted so as to generate first adjusted segments.

According to another embodiment of the present invention, a method of optical proximity correction is also provided and at least includes the following steps. First, at least a feature pattern is provided to a computer system and a common boundary across the feature pattern is defined therein. Afterwards, a first calculation zone and a second calculation zone are defined to respectively overlap different portions of the feature pattern. In a next step, data corresponding to the first calculation zone and the second calculation zone are respectively transmitted to individual central processing units (CPU). During the operation of individual CPUs, the edges of the feature pattern respectively within the first calculation zone and the second calculation zone are fragmented from the common boundary towards two ends of the feature pattern so as to generate at least two first beginning segments and at least two second beginning segments at two sides of the common boundary. Positions of the first beginning segments and the second beginning segments are then respectively adjusted so as to generate first adjusted segments and second adjusted segments. Finally, the first adjusted segments are merged to the second adjusted segments so as to generate an adjusted feature pattern.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The forging aspects and many of the attendant advantages of this invention will become more readily appreciated as the same become better understood by reference to the following detailed description, when taken in conjunction with the accompanying drawings, wherein.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 1:
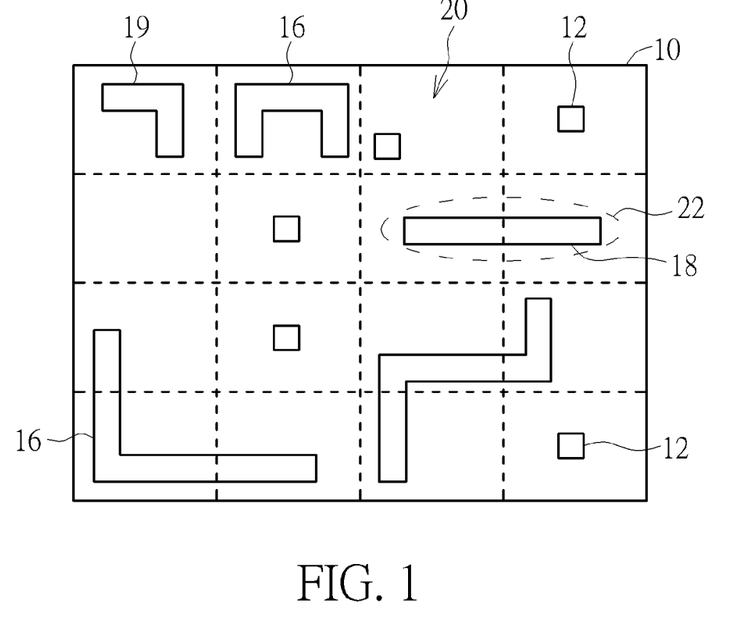
FIG. 1 is a schematic diagram showing a layout pattern stored in a computer system according to one embodiment of the present invention.
Figure 9:
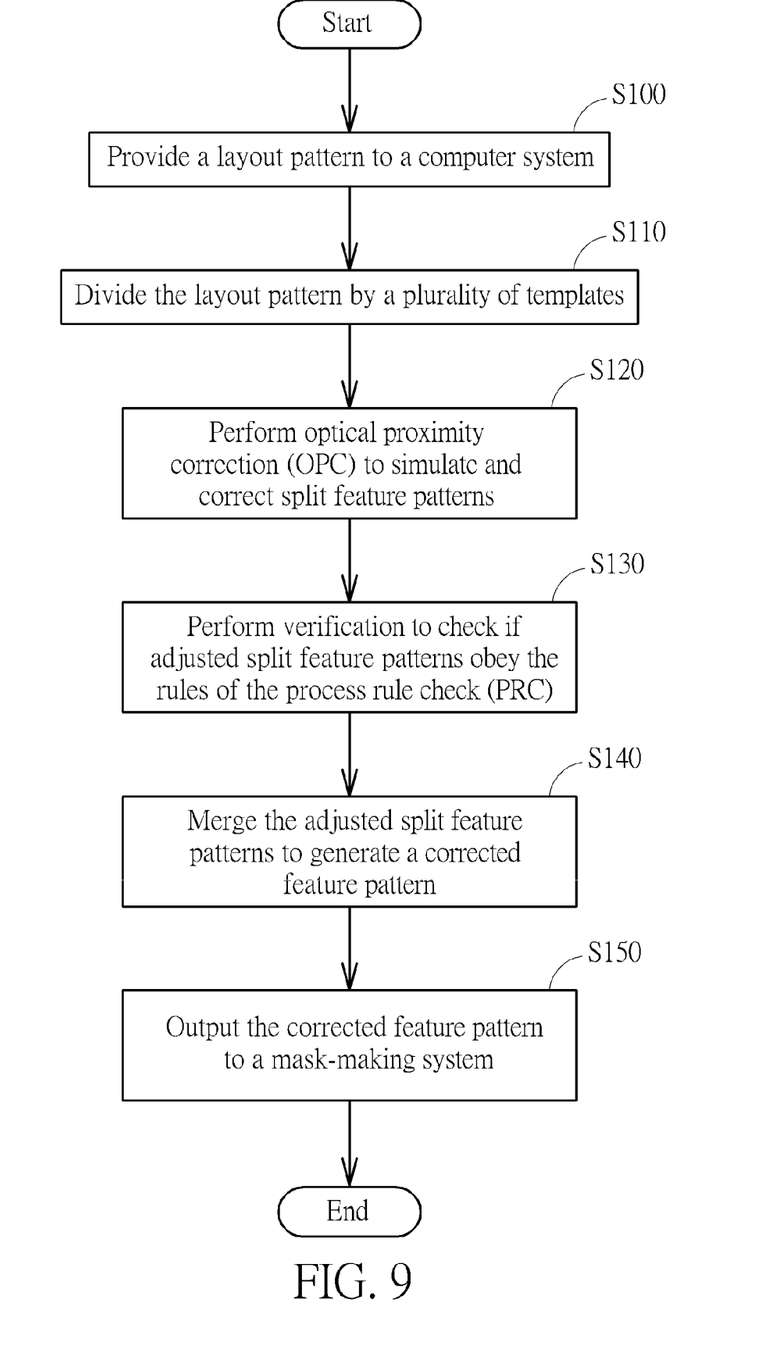
FIG. 9 is a simplified flow chart showing a method for correcting a feature pattern of a layout pattern according to one embodiment of the present invention.

Please refer to FIG. 1 and FIG. 9. FIG. 1 is a schematic diagram showing a layout pattern stored in a computer system according to one embodiment of the present invention. FIG. 9 is a simplified flow chart showing a method for correcting a feature pattern of a layout pattern according to one embodiment of the present invention. As shown in FIG. 1, in step 100, an original layout pattern 10 is first provided to a database of a computer system, such as computer-aided design (CAD) system. The original layout pattern 10, which is an ideal designed pattern supposed to be formed on a wafer, may include a plurality of separately disposed feature patterns used to construct integrated circuits (IC) such as device patterns, contact pad patterns, or layout of circuits, but not limited thereto. According to this embodiment, the original layout pattern 10 at least consists of square patterns 12, straight line patterns 14 and bent line patterns 16, but not limited thereto. In step S110, in order to facilitate the following optical proximity correction (OPC) process, the original layout pattern 10 stored in the computer system is divided by a plurality of templates with rectangular boundary. Preferably, the templates 20 butt against one another and the feature patterns 12, 14 and 16 may distribute in these templates 20. Preferably, the patterns in each of the templates 20 are not identical. That is to say, their designs are different from one another. It should be noted that, however, the patterns in each of the templates 20 may also be designed to have identical layout design in accordance with other specific requirements. According to one embodiment of the present invention, at least one of the feature patterns, e.g. a feature pattern 18 in an encircled region 22, is across or shared by two templates 20.

Figure 2:
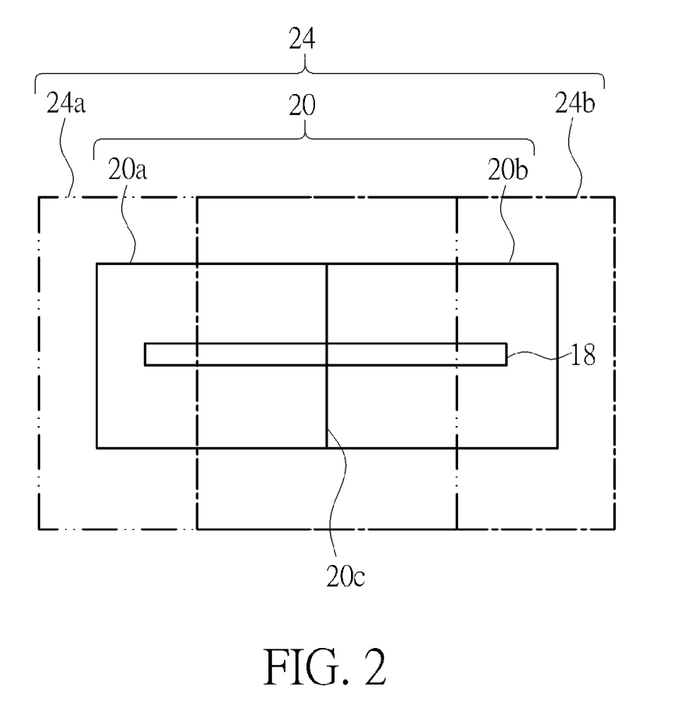
FIG. 2 is an enlarged schematic diagram showing a feature pattern across two adjacent templates according to one embodiment of the present invention.
Figure 10:
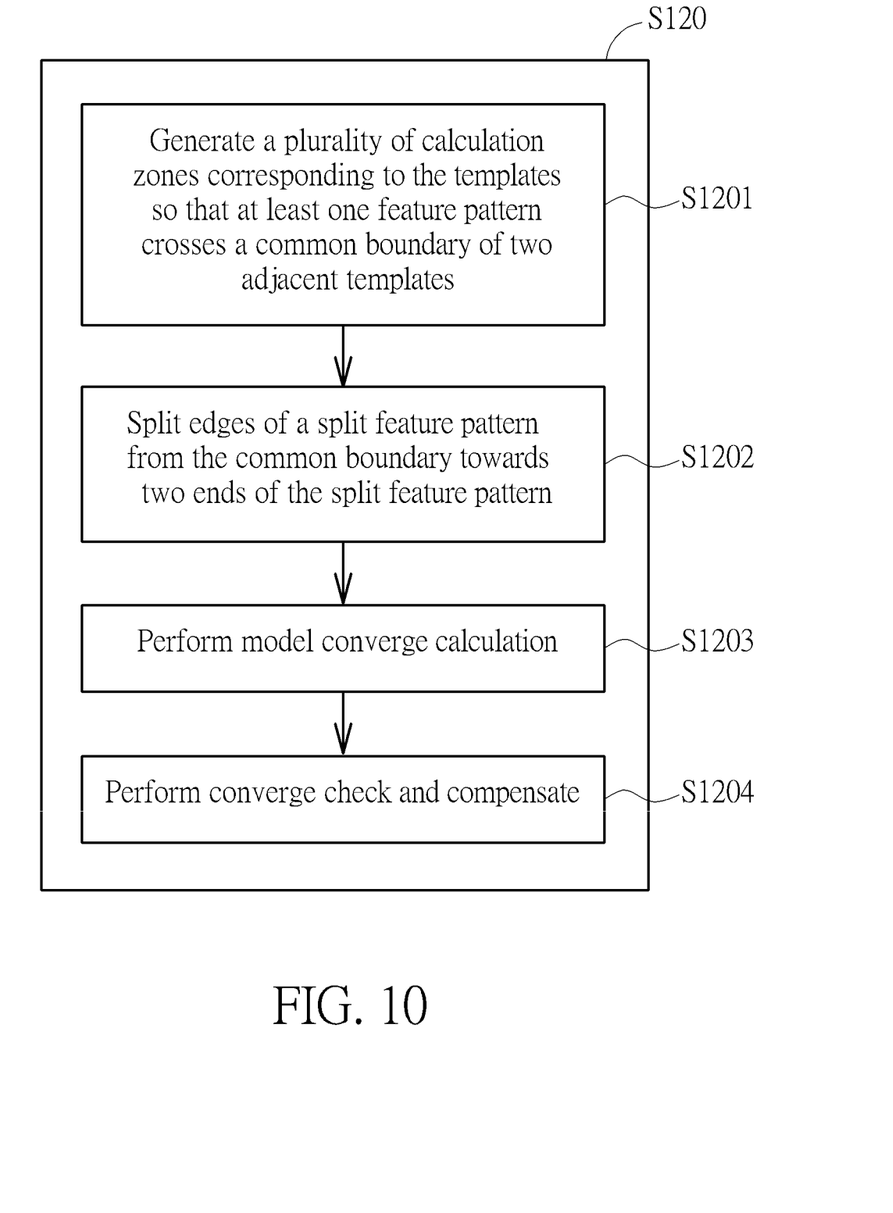
FIG. 10 is a simplified flow chart showing sub-steps of a step in FIG. 9 according to one embodiment of the present invention.

Please refer to FIG. 2, FIG. 9 and FIG. 10. FIG. 2 is an enlarged schematic diagram showing a feature pattern across two adjacent templates according to one embodiment of the present invention. FIG. 10 is a simplified flow chart showing sub-steps of a step in FIG. 9 according to one embodiment of the present invention. As shown in FIG. 2, at least a feature pattern 18 is shared by two adjacent templates 20a and 20b. Precisely, the feature pattern may be a polygon with a suitable length-to-width ratio. For example, the feature pattern 18 is a rectangle with a length-to-width ratio greater than 20, but not limited thereto. At the beginning of step S120, in step 1201, a plurality of calculation zones 24 are generated corresponding to the positions of the templates 20 so that at least one feature pattern 18 can penetrate a common boundary 21 of two adjacent templates 20a and 20b. In detail, the feature pattern 18 may be split into two portions with respect to the common boundary 21 and respectively located at two sides of the common boundary 21. The length the feature pattern 18 in the left templates 20a may be shorter than, equal to, or longer than that of the pattern 18 in the right templates 20b. Preferably, the lengths of the feature pattern 18 in the templates 20a and 20b are unequal.

Still referring to FIG. 2, the calculation zones 24 are preferably generated in a one-to-one approach. In detail, each calculation zone 24 may correspond to single template 20. In order to reducing processing time for the subsequent OPC process, the calculation zones 24 may be respectively transmitted to independent processing units, e.g. central processing unit (CPU). One advantage of transmitting calculation zones 24 to independent CPUs is that the overall OPC processing time can be reduced successfully. It should also be noted that, since the area of the calculation zone is slightly larger than that of the corresponding template, portions of the feature pattern 18 across the common boundary 21 may concurrently overlap the first calculation zone 24a and the second calculation zone 24b. In addition, since each of the calculation zones 24 merely overlaps portions of the feature pattern 18, at least one boundary of each of the calculation zones 24 may cross the feature pattern 18.

Figure 3:
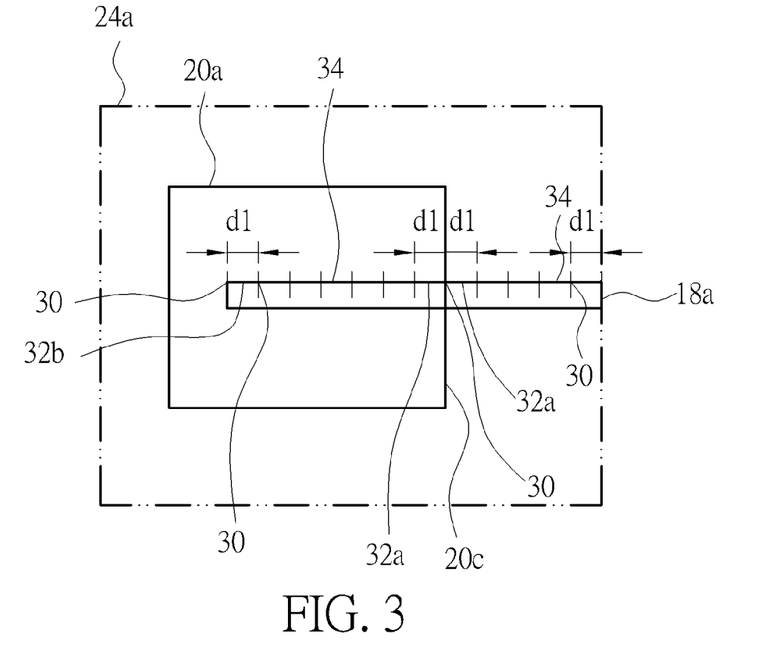
FIG. 3 and FIG. 4 are schematic diagrams respectively showing a fragmented split feature pattern in a single calculation zone according to one embodiment of the present invention.
Figure 4:
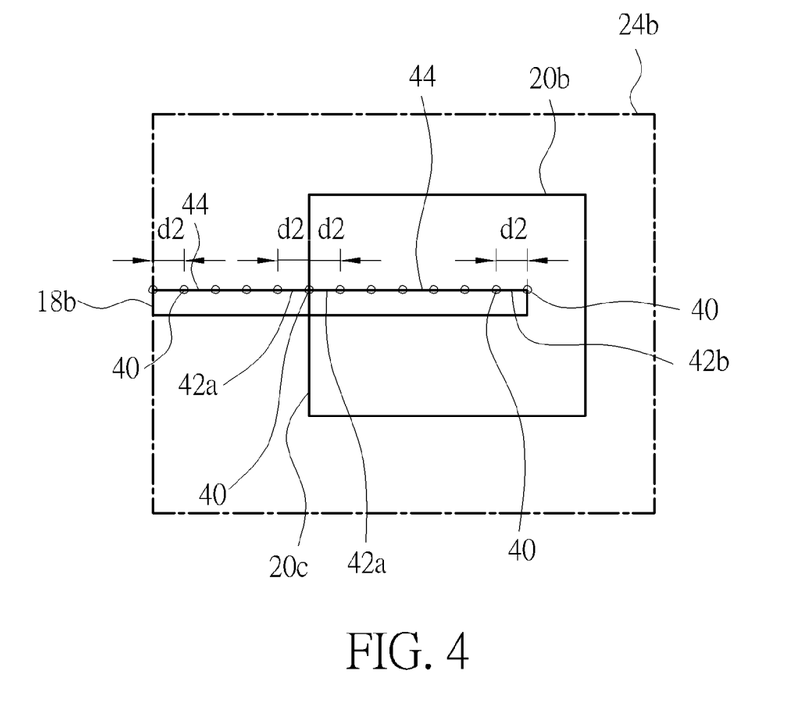

Please refer to FIG. 3 and FIG. 4. FIG. 3 and FIG. 4 are schematic diagrams respectively showing a fragmented feature pattern in a single calculation zone according to one embodiment of the present invention. After step S1201, each of the calculation zones is transmitted to the corresponding independent CPU and simulated by a suitable OPC process. Referring to FIG. 3, in step S1202, the edges of the split feature pattern 18a within the first calculation zone 24a are fragmented by adding fragmentation end points 30 and 34 along them. For example, the fragmentation end points 30 and 34 may be generated in a sequence from the common boundary 21 towards two ends of the split feature pattern 18a so as to generate at least two first beginning segments 32a respectively at two sides of the common boundary 21, but not limited thereto. In detail, at the beginning of the fragmentation, the fragmentation end point 30 is generated on the common boundary 21, which may act as a reference point to determine the first beginning segments 32a. Therefore, the first beginning segments 32a are indirect contact with the common boundary 21. Besides, the fragmentation end points 30 are also respectively generated on a boundary of the first calculation zone 24a and on the end of the split feature pattern 18a to act as reference points to determine the end segments 32b. Therefore, the end segments 32b are respectively in contact with two ends of the split feature pattern 18a. It should be noted that, although there are only two first beginning segments 32a and two end segments 32b depicted in FIG. 3, the number of the first beginning segments and the first end segments may be also respectively more than two in accordance with other embodiments of the present invention. Precisely, the first beginning segments 32a and the first end segments 32b according to the present embodiment are set manually to have equal lengths d1, but not limited thereto. The lengths of the first beginning segments may be set to be different from those of the first end segments according other embodiments. After the generation of the first beginning segments 32a and the first end segments 32b, the remaining edges of the split feature pattern 18a between the beginning segments 32a and the end segments 32b are further fragmented automatically. A plurality of middle segments 32c may be generated during this automatic fragmentation. It should be noted that the lengths and/or the number of the middle segments 32c are preferably determined by the computer system rather than by users. For example, the middle segments 32c may be obtained through automatically averaging the edges of the split feature pattern 18a between the first beginning segments 32a and the first end segments 32b. For this reason, the lengths of the middle segments 32c at the left-hand side of the common boundary 21 may be unequal to those of the middle segments 32c at the right-hand side of the common boundary 21, but not limited thereto.

Please refer to FIG. 4. Similarly, the edges of the split feature pattern 18b within the second calculation zone 24b are also fragmented in step S1202. In step S1201, the edges of the split feature pattern 18b are fragmented by adding several fragmentation endpoints 40 on them. For example, the fragmentation end points 40 and 44 may be generated in a sequence from the common boundary 21 towards two ends of the split feature pattern 18b so as to generate at least two beginning segments 42a respectively at two sides of the common boundary 21, but not limited thereto. In detail, at the beginning of the fragmentation, the fragmentation end point 40 is generated on the common boundary 21, which may act as a reference point to determine the second beginning segments 42a. Therefore, the first beginning segments 42a are indirect contact with the common boundary 21. Besides, the fragmentation end points 40 are respectively generated on a boundary of the second calculation zone 24b and on the end of the split feature pattern 18b. These fragmentation end points 40 may also act as reference points to determine the end segments 42b. Therefore, the second end segments 42b are respectively in contact with two ends of the split feature pattern 18b. It should be noted that, although there are only two second beginning segments 42a and two second end segments 42b depicted in FIG. 4, the number of the second beginning segments and the second end segments may be also more than two respectively in accordance with other embodiments. The second beginning segments 42a and the second end segments 42b according to the present embodiment are set manually to have equal lengths d2, but not limited thereto. The lengths of the second beginning segments may be set to be different from those of the second end segments according other embodiments. After the generation of the first beginning segments 42a and the second end segments 42b, the remaining edges of the split feature pattern 18b between the beginning segments 42a and the end segments 42b are further fragmented automatically. A plurality of middle segments 42c may be generated during this automatic fragmentation. It should be noted that the lengths and/or the number of the middle segments 42c are preferably determined by the computer system rather than set by users. For example, the middle segments 42c may be obtained through automatically averaging the edges of the split feature pattern 18b between the second beginning segments 42a and the second end segments 42b. For this reason, the lengths of the middle segments 42c at the left-hand side of the common boundary 21 may be unequal to those of the middle segments 42c at the right-hand side of the common boundary 21, but not limited thereto.

Figure 5:
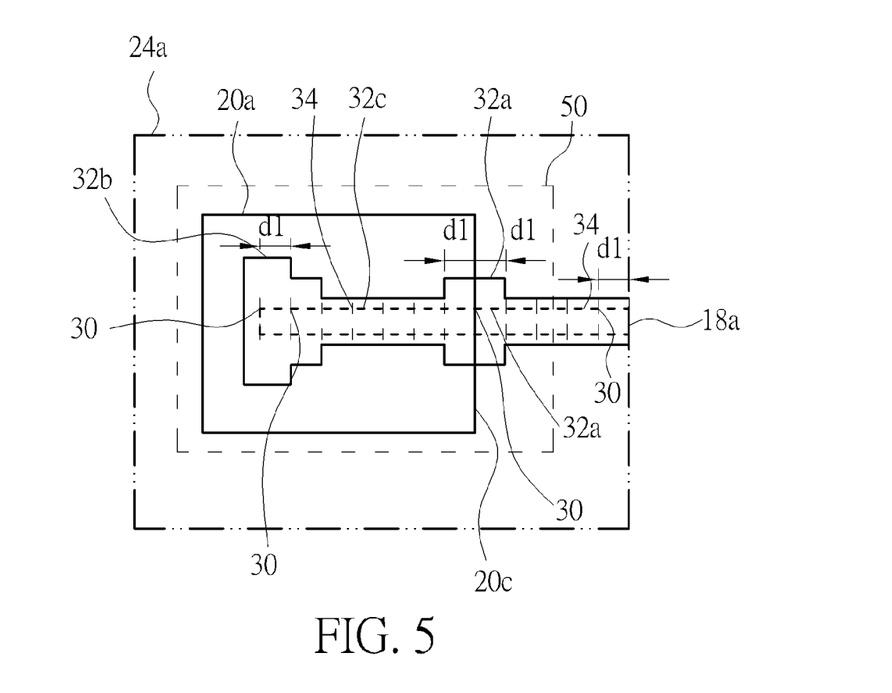
FIG. 5 and FIG. 6 are schematic diagrams respectively showing an adjusted split feature pattern in a single calculation zone according to one embodiment of the present invention.
Figure 6:
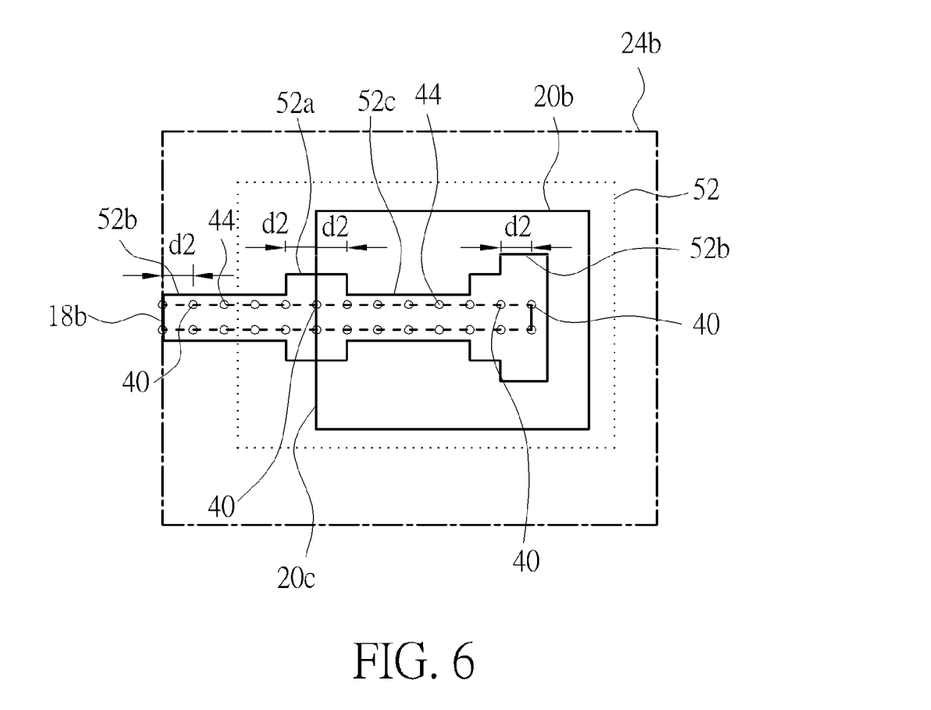

Please refer to FIG. 5 and FIG. 6. FIG. 5 and FIG. 6 are schematic diagrams respectively showing a corrected feature pattern in a single calculation zone according to one embodiment of the present invention. After the fragmentation of the edges of the feature pattern through the above process, in steps S1203 and S1204, these fragmented edges will be corrected and/or simulated in the subsequent OPC process. At this processing stage, the fragmented edges may be individually moved inward or outward so as to generate a corrected layout pattern. Referring to FIG. 5, for example, all of or portions of the beginning segments 32a, the end segments 32b and the middle segments 32c are displaced from their initial positions in terms of light intensity, contrast ratio, pattern density and/or contours of patterns. As shown in FIG. 5, adjusted beginning segments 32a, adjusted end segments 32b and adjusted middle segments 32c are generated during the OPC process and the width of the end of the corrected split feature pattern (depicted in solid lines) is wider than that of the end of the original split feature pattern (depicted in dashed lines). This widened feature is also called hammerhead or serif which is used to avoid the deviation of the transferred patterns during the following photolithography process. It should be noted that, although the beginning segments 32a, the end segments 32b and the middle segments 32c are displaced or adjusted during the OPC process, the fragmentation end points 30 and 34 may be still fixed to their initial positions in order to act as reference points during the whole OPC process, but not limited thereto. After the adjustment, a first output zone 50 is then defined automatically within the first calculation zone 24a. Preferably, the area of the first output zone 50 is smaller than that of the first calculation zone 24a and at least one boundary of the first output zone 50 is interposed between a boundary of the first calculation zone 24a and the common boundary 21. Afterwards, the adjusted feature pattern within the first output zone 50 may be outputted in the following steps. It should be noted that the area of the first output zone 50 may be defined in accordance with a maximum correction value of an outmost feature pattern. The characteristic of the maximum correction value will be described in detail in the following paragraphs.

Please refer to FIG. 6. Similar to the process corresponding to FIG. 5, in steps S1203 and S1204, the fragmented edges within the second calculation zone is also corrected and/or simulated in the OPC process. At this processing stage, the fragmented edges may be individually moved inward or outward so as to generate a corrected layout pattern. Referring to FIG. 6, similarly, all of or portions of the beginning segments 42a, the end segments 42b and the middle segments 42c are displaced from their initial positions in terms of light intensity, contrast ratio, pattern density and/or contours of patterns. During the OPC process, adjusted beginning segments 42a, adjusted end segments 42b and adjusted middle segments 42c are generated and the width of the end of the corrected split feature pattern (depicted in solid lines) is wider than that of the end of the original split feature pattern (depicted in dashed lines). After the adjustment, a second output zone 52 is then defined automatically within the second calculation zone 24b. Preferably, the area of the second output zone 52 is smaller than that of the second calculation zone 24b and at least one boundary of the second output zone 52 is interposed between a boundary of the second calculation zone 24b and the common boundary 21. Afterwards, the corrected feature pattern within the second output zone 52 is outputted in the following steps. It should be noted that the area of the second output zone 52 may be defined in accordance with a maximum correction value of an outmost feature pattern. The characteristic of the maximum correction value will be described in detail in the following paragraphs. Since the correction process depicted in FIG. 6 is similar to that depicted in FIG. 5, these similar process are therefore not disclosed in detail.

Figure 7:
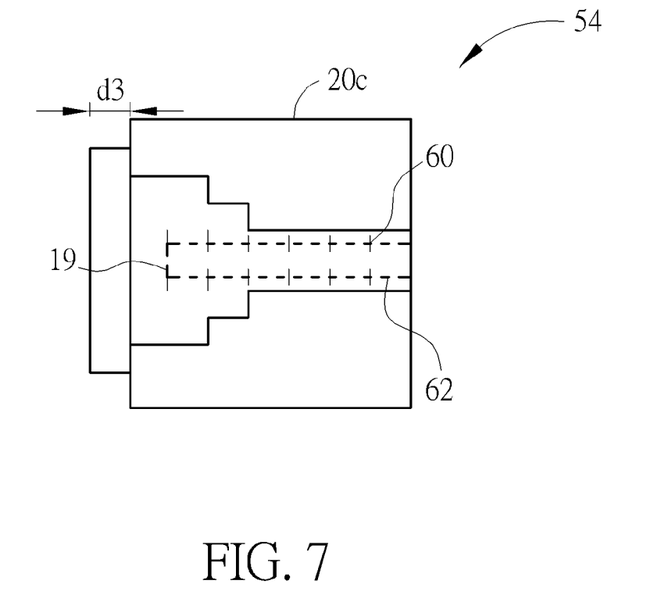
FIG. 7 is a schematic diagram showing an adjusted outmost feature pattern in a template according to one embodiment of the present invention.

Please refer back to FIG. 1. As shown in FIG. 1, the layout pattern 10 may also include at least one outmost feature pattern 19. The outmost feature pattern 19 may be assigned to an outmost template 20c and an outmost calculation zone (not shown). Precisely, the outmost feature pattern 19 may be in any shape and may also be subjected to the simulation and/or correction under the operation of the corresponding CPU. Please refer to FIG. 7. FIG. 7 is schematic diagram showing an adjusted outmost feature pattern in a template according to one embodiment of the present invention. Similarly, the edges of the outmost feature pattern 19 in template 20c may also be fragmented by adding a plurality of fragmentation end points 60 along them so as to generate a plurality of segments 62. Subsequently, each of the segments 62 may be displaced from their initial positions so as to generate an adjusted outmost feature pattern 19'. Since one end of the original outmost feature pattern 19 is close to the boundaries of the layout pattern 10, the adjusted outmost feature pattern 19' may have an extending portion 15 protruding from one boundary of the outmost template 21. In this case, the length d3 of the extending portion 15 is defined as the maximum correction value which is used to determine the areas of the first output zone 50 and the second output zone 52 depicted in FIG. 5 and FIG. 6. For example, the output zone may be generated by adding the maximum correction value to the initial lengths and widths of corresponding template. In this way, the area of the output zone may be therefore slightly larger than that of the corresponding template. According to one embodiment of the present invention, the maximum correction value ranges from 1 nanometer (nm) to 200 nm, and preferably ranges from 5 nm to 50 nm.

Figure 8:
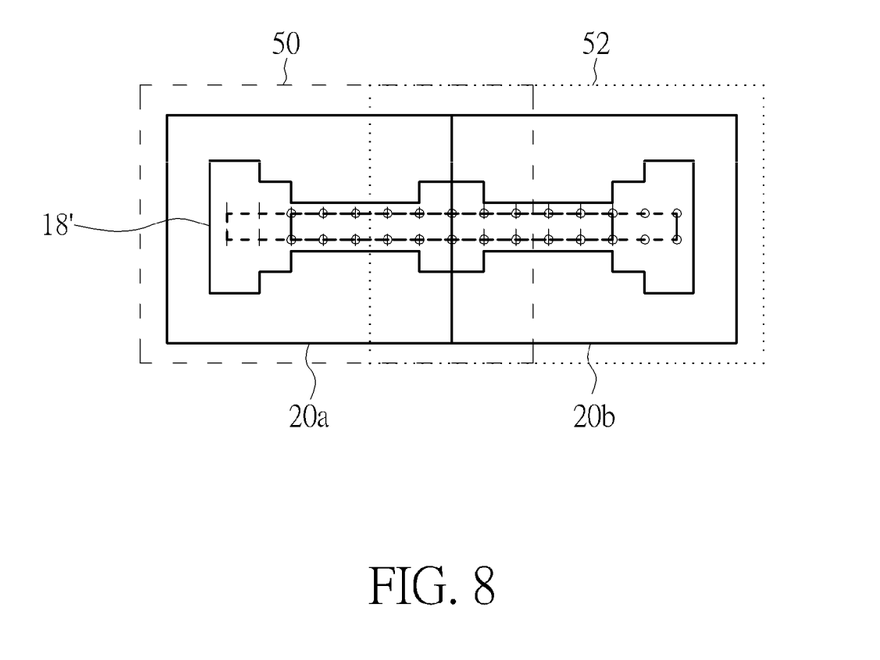
FIG. 8 is a schematic diagram showing a merged feature pattern according to one embodiment of the present invention.

Please refer to FIG. 8. FIG. 8 is schematic diagram showing a merged feature pattern according to one embodiment of the present invention. After the above OPC process, in step 130, a verification process is performed in each CPU to check if an adjusted feature pattern obeys the rules of the process rule check (PRC). When the verification process is completed, in step S140, all of the adjusted split feature patterns stored in the corresponding CPUs will be then merged together by using the common boundary 21 as a reference boundary so as to obtained merged feature pattern 18'. One advantage of the embodiments of the present embodiment is that the adjusted split feature patterns could be merged to the neighboring adjusted split feature patterns with no mismatch. This is because the lengths of the beginning segments within neighboring calculation zones are set to be equal at the beginning of the OPC process. As a result, the adjusted middle segments near the common boundary of the templates could be merged more accurately even though they are corrected and/or simulated in different CPUs. In the following process, in step 150, an electronic file of the corrected layout pattern may be transmitted to a photomask-making system so as to produce the corresponding photomask. Since the fabrication of the photomask is well-known to those skilled in the art, the detailed description of which is therefore omitted for the sake of clarity.

To summarize, the embodiments of the present invention provide a method of an OPC process. During the fragmentation, the beginning segments are first set at two sides of the template and are in direct contact with one boundary of the template. Because the lengths of the beginning segments within the neighboring calculation zones are set to be equal, the adjusted middle segments near the common boundary of the templates could be merged more accurately in the corresponding merging process even though they are corrected and/or simulated in different CPUs. Therefore, time for eliminating or repairing the mismatch at the common boundary may be saved effectively.

As described above, the highly reliable method of the OPC process, which is able to prevent or overcome conventional problems, such as the mismatch of the segments, resulting from the conventional fragmentation process, can be adopted by the manufacturers. Therefore, the invention of the present application is widely applicable to the technical field relating to the semiconductor industry.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of optical proximity correction, comprising:
   providing a layout pattern, wherein the layout pattern comprises a plurality of separately disposed feature patterns;
   providing at least one of the feature patterns to a computer system;
   defining at least a first template and a second template so that portions of the feature pattern are located in the first template and the rest of the feature pattern is located in the second template, wherein the first template and the second template have a common boundary;
   defining a first calculation zone, wherein the first calculation zone overlaps an entire first template and portions of the feature pattern out of the first template;
   fragmenting edges of the feature pattern within the first calculation zone from the common boundary towards two ends of the feature pattern so as to generate at least two first beginning segments respectively at two sides of the common boundary; and
   adjusting positions of the first beginning segments so as to generate first adjusted segments.

2. The method according to claim 1, wherein the feature pattern is rectangle with a length-to-width ratio greater than 20.

3. The method according to claim 1, wherein the first template and the second template butt against each other.

4. The method according to claim 1, wherein the common boundary crosses the feature pattern.

5. The method according to claim 1, wherein a boundary of the first calculation zone crosses the feature pattern.

6. The method according to claim 1, further comprising transmitting the feature pattern within the first calculation zone to a processing unit before a step for fragmenting the edges of the feature pattern within the first calculation zone.

7. The method according to claim 1, further comprising:
   defining a first output zone, wherein a boundary of the first output zone is between a boundary of the first calculation zone and the common boundary; and
   outputting the first adjusted segments within the first output zone.

8. The method according to claim 7, further comprising:
   providing an outmost feature pattern to the computer system;
   defining an outmost template, wherein the outmost template covers the outmost feature pattern; and
   calculating the outmost feature pattern so as to generate a corrected outmost feature pattern, wherein the corrected outmost feature pattern has an extending portion protruding from a boundary of the outmost template and having a maximum correction value.

9. The method according to claim 8, wherein a distance defined between the boundary of the first output zone and the common boundary has the maximum correction value.

10. The method according to claim 1, further comprising:
defining a second calculation zone, wherein the second calculation zone overlaps an entire second template and portions of the feature pattern out of the second template;
fragmenting edges of the feature pattern within the second calculation zone from the common boundary towards two ends of the feature pattern so as to generate at least two second beginning segments respectively at two sides of the common boundary; and
adjusting positions of the second beginning segments so as to generate second adjusted segments.

11. The method according to claim 10, wherein a boundary of the second calculation zone crosses the feature pattern.

12. The method according to claim 10, further comprising transmitting a data of the feature pattern within the second calculation zone to a processing unit before a step for fragmenting the edges of the feature pattern within the second calculation zone.

13. The method according to claim 10, further comprising:
defining a second output zone, wherein a boundary of the second output zone is between a boundary of the second calculation zone and the common boundary; and
outputting the second adjusted segments within the second output zone.

14. The method according to claim 10, further comprising merging the first adjusted segments to the second adjusted segments so as to generate an adjusted feature pattern.

15. The method according to claim 14, further comprising outputting the adjusted feature pattern to a photomask-making system.

16. The method according to claim 10, wherein a length of each of the first beginning segments is equal to a length of each of the second beginning segments.

17. The method according to claim 10, wherein lengths of the first beginning segments are all equal.

18. The method according to claim 10, wherein portions of the feature pattern overlap the first calculation zone and the second calculation zone.

19. A method of optical proximity correction, comprising:
providing at least a feature pattern to a computer system;
defining a common boundary crossing the feature pattern;
defining a first calculation zone, wherein the first calculation zone overlaps portions of the feature pattern and the common boundary;
fragmenting edges of the feature pattern within the first calculation zone from the common boundary towards two ends of the feature pattern so as to generate at least two first beginning segments respectively at two sides of the common boundary;
adjusting positions of the first beginning segments so as to generate first adjusted segments;
defining a second calculation zone, wherein the second calculation zone overlaps portions of the feature pattern and the common boundary, wherein portions of the feature pattern overlap the first calculation zone and the second calculation zone;
fragmenting edges of the feature pattern within the second calculation zone from the common boundary towards two ends of the feature pattern so as to generate at least two second beginning segments respectively at two sides of the common boundary;
adjusting positions of the second beginning segments so as to generate second adjusted segments; and
merging the first adjusted segments to the second adjusted segments so as to generate an adjusted feature pattern.

20. The method according to claim 19, further comprising:
defining a first output zone, wherein the first output zone is in the first calculation zone;
defining a second output zone, wherein the second output zone is in the second calculation zone; and
outputting the first and the second adjusted segments respectively within the first output zone and the second output zone.

21. The method according to claim 20, further comprising:
providing an outmost feature pattern to the computer system;
defining an outmost template, wherein the outmost template covers the outmost feature pattern; and
calculating the outmost feature pattern so as to generate a corrected outmost feature pattern, wherein the corrected outmost feature pattern has an extending portion protruding from a boundary of the outmost template with a maximum correction value.

22. The method according to claim 21, wherein a distance defined between a boundary of the first output zone and the boundary has the maximum correction value.

* * * * *